United States Patent
Keidar-Barner et al.

(10) Patent No.: US 8,914,757 B1
(45) Date of Patent: Dec. 16, 2014

(54) EXPLAINING ILLEGAL COMBINATIONS IN COMBINATORIAL MODELS

(71) Applicant: International Business Machines Corporation, Armonk, NY (US)

(72) Inventors: Sharon Keidar-Barner, Megiddo (IL); Itai Yosef Segall, Tel-Aviv (IL); Rachel Tzoref-Brill, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/043,863

(22) Filed: Oct. 2, 2013

(51) Int. Cl.
| | |
|---|---|
| *G06F 17/50* | (2006.01) |
| *G06F 17/11* | (2006.01) |
| *G06F 11/00* | (2006.01) |
| *G06F 11/26* | (2006.01) |
| *G06F 11/263* | (2006.01) |

(52) U.S. Cl.
CPC ............ *G06F 1/5081* (2013.01); *G06F 17/504* (2013.01); *G06F 11/00* (2013.01); *G06F 17/11* (2013.01); *G06F 11/261* (2013.01); *G06F 2217/14* (2013.01); *G06F 17/5022* (2013.01); *G06F 11/263* (2013.01)
USPC ............... 716/106; 716/111; 716/136; 703/2; 703/16; 714/732; 714/32; 714/37; 717/104; 717/126; 717/128

(58) Field of Classification Search
CPC ... G06F 17/5022; G06F 17/504; G06F 17/11; G06F 2217/14; G06F 2217/35; G06F 11/00; G06F 11/261; G06F 11/263; G06F 17/5081
USPC ......... 716/106, 111, 136; 703/2, 16; 714/732, 714/32, 37; 717/104, 126, 128
See application file for complete search history.

(56) References Cited

U.S. PATENT DOCUMENTS

| | | | | |
|---|---|---|---|---|
| 6,728,665 | B1 * | 4/2004 | Gupta et al. ................... | 703/2 |
| 6,952,690 | B2 * | 10/2005 | Lumpp et al. .................. | 706/47 |
| 7,779,399 | B2 * | 8/2010 | Huang et al. .................. | 717/154 |
| 7,992,113 | B1 | 8/2011 | Goldberg | |
| 8,108,195 | B2 | 1/2012 | Geist et al. | |
| 8,121,827 | B2 | 2/2012 | Azatchi et al. | |
| 8,532,971 | B2 * | 9/2013 | Ganai ............................. | 703/14 |
| 8,555,269 | B2 * | 10/2013 | Huang et al. .................. | 717/154 |

(Continued)

OTHER PUBLICATIONS

Shakya et al., "Isolating Failure-Inducing Combinations in Combinatorial Testing Using Test Augmentation and Classification", IEEE Fifth International Conference on Software Testing, Verification and Validation (ICST), 2012, pp. 620-623.

(Continued)

*Primary Examiner* — Phallaka Kik

(74) *Attorney, Agent, or Firm* — Jason H. Sosa; Suzanne Erez

(57) ABSTRACT

A method, system and product for explaining illegal combinations in combinatorial models. The method comprising obtaining a combinatorial model and an illegal combination that is excluded from the model by one or more restrictions, utilizing a Satisfiability solver on a satisfiability formula that encodes the legal test space and that assigns values to attributes as defined by the illegal combination, whereby the satisfiability solver provides an indication of unsatisfiability of the satisfiability formula and an UNSAT core comprising a subset of clauses defined by the satisfiability formula which are unsatisfiable; and identifying the one or more restrictions by mapping the clauses of the UNSAT core with clauses encoding the set of restrictions.

19 Claims, 3 Drawing Sheets

(56) References Cited

U.S. PATENT DOCUMENTS

| | | | |
|---|---|---|---|
| 8,645,439 B2* | 2/2014 | Kinsman et al. | 708/204 |
| 2004/0039718 A1* | 2/2004 | Lumpp et al. | 706/47 |
| 2007/0074188 A1* | 3/2007 | Huang et al. | 717/141 |
| 2011/0113285 A1* | 5/2011 | Dolby et al. | 714/28 |
| 2011/0184705 A1* | 7/2011 | Ganai | 703/2 |
| 2011/0197180 A1* | 8/2011 | Huang et al. | 717/126 |
| 2012/0023149 A1* | 1/2012 | Kinsman et al. | 708/204 |
| 2012/0131309 A1* | 5/2012 | Johnson et al. | 712/41 |
| 2012/0317454 A1 | 12/2012 | Krenz-Baath et al. | |
| 2012/0324414 A1 | 12/2012 | Tzoref-Brill et al. | |

OTHER PUBLICATIONS

Jussila et al., "Extended Resolution Proofs for Symbolic SAT Solving with Quantification", SAT'06 Proceedings of the 9th international conference on Theory and Applications of Satisfiability Testing, 2006, pp. 54-60.

Zhang et al., "Validating SAT solvers using an independent resolution-based checker: practical implementations and other applications", DATE '03 Proceedings of the conference on Design, Automation and Test in Europe—vol. 1, 2003.

Chatterjee et al., "On Resolution Proofs for Combinational Equivalence", DAC '07 Proceedings of the 44th annual Design Automation Conference, pp. 600-605, 2007.

Een et al., "Temporal Induction by Incremental SAT Solving", Electronic Notes in Theoretical Computer Science, vol. 89, Issue 4, 2003, pp. 543-560.

* cited by examiner

EXPLAINING ILLEGAL COMBINATIONS IN COMBINATORIAL MODELS

TECHNICAL FIELD

The present disclosure relates to testing in general, and to testing using combinatorial models, in particular.

BACKGROUND

A combinatorial model, also referred to as Cartesian-product model, is a set of attributes, values for the attributes (also referred to as domains), and restrictions on value combinations that may not appear together. Such a model spans a space of valid tests: each combination of values to the attributes that does not violate any restriction corresponds to a valid test. Each combination of attributes or a subset of attributes, which is excluded by one or more restrictions is referred to as an illegal combination.

Combinatorial models have a variety of usages. One such usage is functional coverage analysis of a System Under Test (SUT). Another usage is in Combinatorial Test Design (CTD). CTD is a test planning technique that selects a small subset of the valid test space that covers a predefined coverage goal. The coverage goal may define an interaction level of attributes that are to be covered, such as every n-wise combinations of values.

Preparing a combinatorial model may be a difficult task for a user, such as a verification engineer, a QA staff member, or the like. In particular, correctly capturing the restrictions over the model may be an important yet work-intensive and non-trivial task. Under-restricting the model may yield tests that cannot be executed and may cause coverage gaps if such tests are skipped or manually modified. Over-restricting the model also yields coverage gaps in the areas that are wrongly restricted.

BRIEF SUMMARY

One exemplary embodiment of the disclosed subject matter is a computer-implemented method comprising: obtaining a combinatorial model defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case; obtaining an illegal combination, wherein the illegal combination is excluded by one or more restrictions; utilizing a Satisfiability solver, executed by a processor, on a satisfiability formula that encodes the legal test space and that assigns values to attributes as defined by the illegal combination, whereby the satisfiability solver provides an indication of unsatisfiability of the satisfiability formula and an UNSAT core comprising a subset of clauses defined by the satisfiability formula which are unsatisfiable; and identifying the one or more restrictions by mapping the clauses of the UNSAT core with clauses encoding the set of restrictions.

Another exemplary embodiment of the disclosed subject matter is a computerized apparatus having a processor, the processor being adapted to perform the steps of: obtaining a combinatorial model defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case; obtaining an illegal combination, wherein the illegal combination is excluded by one or more restrictions; utilizing a Satisfiability solver on a satisfiability formula that encodes the legal test space and that assigns values to attributes as defined by the illegal combination, whereby the satisfiability solver provides an indication of unsatisfiability of the satisfiability formula and an UNSAT core comprising a subset of clauses defined by the satisfiability formula which are unsatisfiable; and identifying the one or more restrictions by mapping the clauses of the UNSAT core with clauses encoding the set of restrictions.

Yet another exemplary embodiment of the disclosed subject matter is a computer program product comprising: a non-transitory computer readable medium retaining program instructions, which instructions when read by a processor, cause the processor to perform a method comprising: obtaining a combinatorial model defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case; obtaining an illegal combination, wherein the illegal combination is excluded by one or more restrictions; utilizing a Satisfiability solver on a satisfiability formula that encodes the legal test space and that assigns values to attributes as defined by the illegal combination, whereby the satisfiability solver provides an indication of unsatisfiability of the satisfiability formula and an UNSAT core comprising a subset of clauses defined by the satisfiability formula which are unsatisfiable; and identifying the one or more restrictions by mapping the clauses of the UNSAT core with clauses encoding the set of restrictions.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1A:
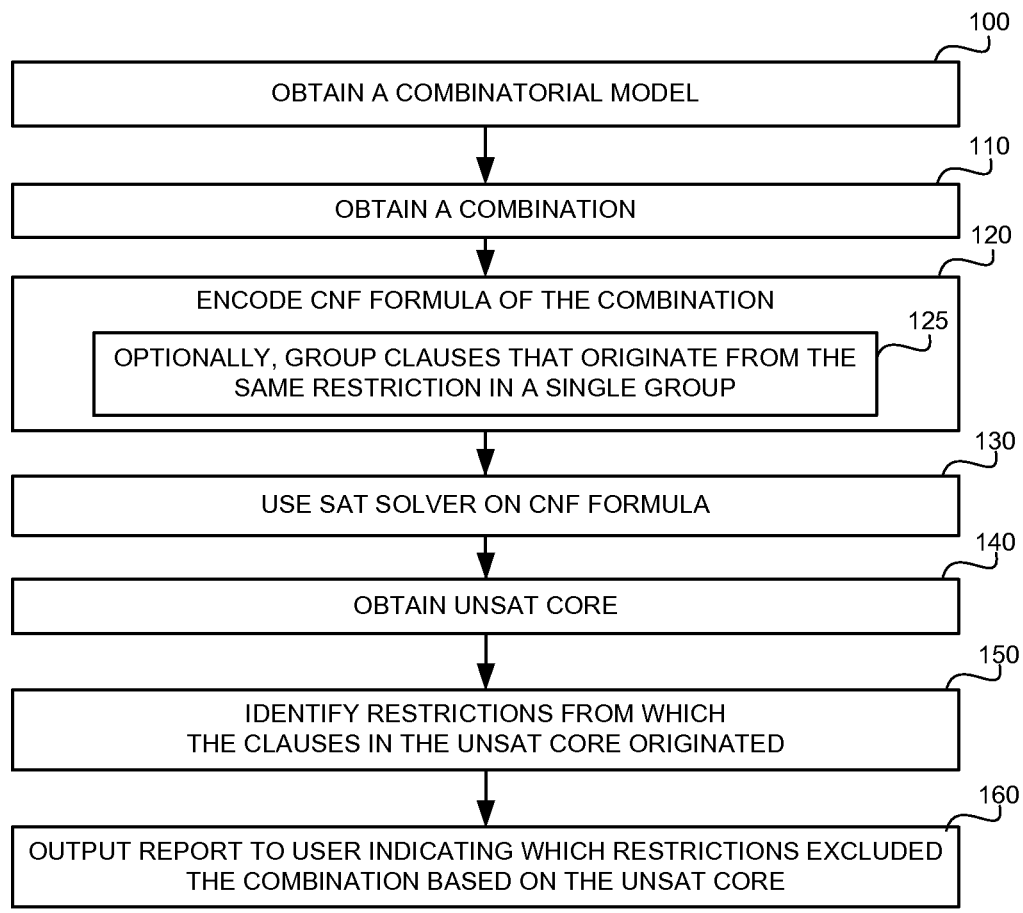
FIG. 1A shows a flowchart diagram of a method, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to assist the user to understand reasons for which a combination is excluded in a combinatorial model. Another technical problem is to identify restrictions defined in the combinatorial model which exclude the combination from the valid test space.

A combinatorial model defines a test space that is an aggregation of coverage tasks that can be tested. Each coverage task is a full assignment of values to a set of attributes. The assigned values are selected from a respective domain of each attribute. One or more coverage tasks may be restricted from the test space using a restriction. The restriction may define a partial assignment to the attributes that is restricted. As an example, in a model having four attributes A, B, C, D each being associated with a respective domain $D_A=\{a_1, a_2\}$, $D_B=\{b_1, b_2\}$, $D_C=\{c_1, c_2\}$, $D_D=\{d_1,d_2,d_3\}$. A restriction $A=a_1 \wedge B=b_1$ excludes from the test space all coverage tasks that assign the value of $a_1$ to A and the value $b_1$ to B.

A combination is an assignment of values to one or more attributes of the model. A full combination provides for a full assignment of values to the attributes. For example, in the model defined above, a full combination may be $(A=a_1, B=b_1, C=c_1, D=d_1)$ as it defines an assignment to each attribute of the model.

A partial combination provides a partial assignment of values to the attributes. For example, in the model defined above, a partial combination may be $(A=a_1, B=b_1)$ as it only defines assignment of two out of the four attributes of the model. An extension of a partial combination is a combination which provides in addition to the partial assignment of the partial combination assignment to additional attributes of the model. The extension may be a full combination or may be a partial combination in itself. $(A=a_1, B=b_1, C=c_1, D=d_1)$ may be an extension of the partial combination defined above. Similarly, $(A=a_1, B=b_1, C=c_2, D=d_2)$ may also be an extension of the same partial combination.

A combination is said to be an illegal combination, if every extension of the combination (or the combination itself, in case of a full combination) is restricted from the model by at least one restriction. For example, $(A=a_1, B=b_1, C=c_2, D=d_2)$ may be an illegal combination as it is restricted by the restriction $A=a_1 \wedge B=b_1$. Similarly, the partial combination $(A=a_1, B=b_1)$ is also an illegal combination as it may also be restricted by the same restriction.

In some cases, several restrictions may together exclude combinations of partial assignments that are not restricted by any of the restrictions alone. Such excluded combinations are referred to as derived restrictions. The derived restrictions may exclude combination of values that the user who defined the restrictions did not originally intend to exclude. A restriction that is defined explicitly in the model and is not a derived restriction may be referred to as an explicit restriction.

One technical solution provided by the disclosed subject matter is to utilize a satisfiability solver to identify which restrictions participate in excluding an illegal combination from the test space. The satisfiability solver may be a Boolean satisfiability solver, also referred to as a SAT solver, a Constraint Satisfaction Problem (CSP) solver, or the like.

The satisfiability solver is a tool that determines if there exists an interpretation that satisfies a given satisfiability formula, such as a Boolean formula, a CSP, or the like.

Hereinbelow, the disclosed subject matter is described with respect to a SAT solver examining a Boolean formula given in Conjunctive Normal Form (CNF). However, the disclosed subject matter is not limited to such an embodiment.

A CNF formula may be defined as a conjunction of clauses, wherein each clause is a disjunction of literals, wherein each literal represents a valuation to a Boolean variable (e.g., TRUE or FALSE). Other forms of formulas are known in the art, such as but not limited to Disjunctive Normal Form (DNF), CSP, or the like.

The combinatorial model may be encoded to CNF formula (or other satisfiability formula). Each attribute may be encoded using one or more Boolean variables that are used to define the value of the attribute which is selected from the corresponding domain. Each restriction may be defined using one or more clauses. The legal test space may be encoded by a CNF which conjuncts a negation of all the restrictions. A CNF encoding the legal test space is referred to hereinafter as legal CNF.

Referring again to the example above, the model may be encoded using 5 Boolean variables $v_a, v_b, v_c, v_{d_1}, v_{d_2}$. $v_a$ may encode the attribute A (e.g., literal $v_a$, indicating variable $v_a$ is assigned TRUE value, for $a_1$, and literal $v'_a$, indicating that variable $v_a$ is assigned FALSE value, for $a_2$). Similarly, attributes B and C are encoded using one Boolean variable. In view of the domain of attribute D comprising 3 values, it may be encoded using two Boolean variables (for example, $v_{d_1} \wedge v_{d_2}$, for $d_1$, $v'_{d_1} \wedge v_{d_2}$ for $d_2$, and $v'_{d_1} \wedge v'_{d_2}$ for $d_3$). A negation of a restriction excluding assignment of value $a_2$ to A may be represented by a single clause: $(v_a)$. A negation of a restriction excluding assignment of value $d_2$ to D may be represented by a single clause as well $(v'_{d_2} \vee v_{d_1})$. However, some restrictions may be represented by several clauses such as the case of a restriction excluding both assignment of value $a_2$ to A and assignment of value $d_2$ to D. A negation of such restriction may be represented by two clauses $(v'_{d_2} \vee v_{d_1})$ and $(v_a)$. The above are given in a manner of an example only and the disclosed subject matter is not limited to such an encoding, such restrictions, or such representations of the restrictions.

The SAT solver may be utilized to provide an explanation as to why a combination (which may be partial or full) is illegal. The SAT solver may be fed with a CNF formula which is a conjunction of the legal CNF and a CNF representing an assignment of values in accordance with the examined combination. If the examined combination is an illegal combination, the SAT solver determines that the formula is unsatisfiable. The SAT solver may provide an unsatisfiable core, also referred to as UNSAT core. The UNSAT core comprises a subset of the clauses of the CNF formula whose conjunction is still unsatisfiable. The UNSAT core may be examined to detect which restrictions take part in excluding the illegal combination from the combinatorial model. In some exemplary embodiments, each clause that is included in the UNSAT core is examined to determine whether it corresponds to a restriction. Referring to the example above, and assuming that model includes restriction R defined as $D \neq d_2$, if the clause $(v'_{d_2} \vee v_{d_1})$ is found in the UNSAT core, the restriction R is deemed to be involved in excluding the combination from the model. A plurality of restrictions may take part and together exclude the combination. It will be noted that in some exemplary embodiments the UNSAT core would not comprise any clause associated with a derived restriction, as such a clause is not part of the original CNF that is fed to the SAT solver.

In some exemplary embodiments, the SAT solver may be configured to provide a grouped UNSAT core. In such an embodiment, the clauses are partitioned into groups, and the SAT solver finds a small subset of the groups that correspond to an unsatisfiable sub-formula. The grouped UNSAT core may comprise groups of clauses, so as that if one clause of the group is included in the grouped UNSAT core all clauses of the same group are also included in the grouped UNSAT core. In such an embodiment, each group is considered as an atomic unit that can either be included in the grouped UNSAT core or excluded therefrom.

Note that a single restriction may be translated into several clauses. In the grouped UNSAT cores setting, a set of clauses that correspond to a single restriction may represent a group. Each additional clause not defined by the restrictions, such as clauses defined by the legal CNF, may be treated as a separate group of exactly one clause. The SAT solver may then find a small subset of groups which is unsatisfiable, and which corresponds to a small subset of complete restrictions. This is as opposed to non-grouped UNSAT cores, in which specific clauses are chosen from each restriction. In certain cases the use of grouped UNSAT cores may lead to a result (e.g explanation) that consists of less restrictions than is provided based on a non-grouped UNSAT core.

A different group may be defined for each restriction thereby coupling the clauses of each restriction together to either be included in or excluded from the grouped UNSAT core. In some exemplary embodiments, each clause of the legal CNF may be associated with a unique group to avoid grouping of such clauses.

In some exemplary embodiments, the SAT solver may provide a proof of unsatisfiability. In some exemplary embodiments, the proof of unsatisfiability provides a proof that the UNSAT core is unsatisfiable. In some exemplary embodiments, the proof may be a resolution graph indicating deduction steps from the clauses of the UNSAT core (and therefore, the original CNF formula which is analyzed by the SAT solver) that result in a contradiction.

Moreover, the SAT solver can provide the proof of unsatisfiability, which can be then transformed to a series of deduction steps from the restrictions to the illegal combination. Such a proof may be leveraged as further information for the user, as an explanation of why the chosen restrictions indeed exclude the combination. The deduction steps can be enhanced with template-based text to make the explanation more readable to the average user.

In some exemplary embodiments, the combination may be translated into a set of assumptions given to the SAT solver. The SAT solver may solve a formula under a set of assumptions. In this case, a conflicting set of assumptions can be obtained directly by conflict analysis within the solver and the explanation that the combination is illegal can be constructed from the analysis of the solver's learned clauses.

One technical effect of utilizing the disclosed subject matter is assisting a user to understand the combinatorial model. The user may be given explanation as to why a combination is illegal. Another technical effect relates to a scenario in which there are restrictions that contradict one another. In such a model, every combination may be considered as illegal. The disclosed subject matter may be useful in identifying the restrictions that contradict one another as such restrictions may take part in excluding any combination. Additionally or alternatively, the user may remove one restriction from the model and use it as a combination. If there is a contradiction, the combination would be considered illegal and the reason may be illuminated by the disclosed subject matter.

In some exemplary embodiments, the disclosed subject matter may provide for user-friendly explanations to the users, such as by displaying a deduction graph, by listing extensions and indicating for each extension which restrictions exclude it, by utilizing template-based text that is more readable to an average user, or the like.

Reference in now made to FIG. 1A showing a flowchart diagram of a method, in accordance with some exemplary embodiments of the disclosed subject matter.

In Step 100, a combinatorial model is obtained. The model may be obtained from an electronic source, from a user, or from any other source.

In Step 110, a combination is obtained. The combination may be a partial or a full combination. The combination may be provided by the user. In some exemplary embodiments, the user may provide combination that he knows to be illegal in the combinatorial model.

In Step 120, a CNF formula of the combination in the model may be encoded. The CNF formula may encode all legal combinations such as by encoding a conjunction of a negation of all the restrictions (e.g., $\bigcap_i \neg R_i$). The CNF formula may also encode assignments to values based on the values of the combination (e.g., clauses that enforce assigning values as defined by the combination).

In some exemplary embodiments, Step 125 may be performed. In Step 125, clauses that originate from the same restriction are indicated as being members of the same group. Every additional clause may be included in a unique group that includes only that clause. In such an embodiment, grouped UNSAT core will include a set of groups that render the CNF formula unsatisfiable. Hence, if one clause from a restriction participates in the UNSAT core, all clauses that originate from that restriction will also be included. As can be appreciated, in some cases, grouped UNSAT core may provide a different result than an UNSAT core, and may indicate fewer restrictions to interact in order to render the CNF formula as unsatisfiable (i.e., render the combination to be illegal).

In Step 130, a SAT solver may utilized on the CNF formula. The SAT solver may be, for example, based on Davis-Putnam-Logemann-Loveland (DPLL) algorithm, or based on any other SAT solving algorithm. In some exemplary embodiments, the SAT solver may be configured to provide an UNSAT core in case of a determination that the CNF formula is unsatisfiable. Additionally or alternatively, the SAT solver may be configured to generate a proof of unsatisfiability.

In case the combination of Step 110 is an illegal combination in the model of Step 100, the SAT solver may indicate that the CNF formula is unsatisfiable.

In Step 140, an UNSAT core is obtained from the SAT Solver. In some exemplary embodiments, the UNSAT core may be a grouped UNSAT core. Additionally or alternatively, the UNSAT core may be a minimal UNSAT core. An UNSAT core is called a minimal UNSAT core, if every proper subset (allowing removal of any arbitrary clause or clauses) of it is satisfiable. Thus, such a core may be a local minimum and not necessarily a global minimum.

In Step 150, a mapping between the clauses and the restrictions may be utilized to identify which restrictions of the model cause the combination to be illegal. By identifying for each clause in the UNSAT core whether it originated from any restriction (e.g., the clause takes part in encoding the restriction) and identifying such restrictions, the restrictions which exclude the combination may be determined. It will be noted that there may be additional combinations of restrictions that would exclude the combination from the model.

In some exemplary embodiments, during encoding (Step 120), each restriction is encoded into one or more clauses. A mapping between the clauses and the restrictions from which they originated may be retained and utilized in Step 150.

In Step 160, a report may be outputted to the user to indicate which restrictions rendered the combination illegal in the model. The report may list the restrictions that together exclude the combination.

In some exemplary embodiments, in the case where the combination is a partial combination, the report may include all possible full extensions of the partial combination. Each full extension may be listed along with one restriction that excludes that extension. In some exemplary embodiments, the restriction may be selected from the UNSAT core. Additionally or alternatively, the report may include a list of extensions that represent all full extension of the partial combination. The extensions may extend the partial combination to include the attributes that participate in excluding the combination. As an example, in a partial combination assigning value to attributes $A_1 \ldots A_k$ out of N attributes (N>k), the extensions may assign values to attributes $A_1 \ldots A_j$ (N>j>k), thereby, in addition to assigning values to the original attributes of the partial combination ($A_1 \ldots A_k$) as prescribed in the partial combination, additional attributes of the extension ($A_{k+1} \ldots A_j$) are also assigned values. By providing all extension to all combinations of values of the ($A_{k+1} \ldots A_j$) attributes, and explaining for each extension why it is excluded (e.g., which restrictions exclude it), the user may better understand the combinatorial model and realize why the partial combination is indeed restricted. In one embodiment, the additional attributes who are assigned value in the extension may be chosen by the user. Additionally or alternatively, the additional attributes may be chosen based on the set of restrictions that exclude the partial combination. In some exemplary embodiments, the additional attributes may include all attributes appearing in the set of restriction and not appearing in the partial combination.

In some exemplary embodiments, in case the user provides a partial combination in Step 110 and in case a report detailing the extensions is desired, each extension of the partial combination is generated (e.g., by enumerating all possible combination of values to unassigned attributes). Each such extension is then treated as the combination being inspected in steps 120-150 to determine which restriction excludes it from the model.

Figure 1B:
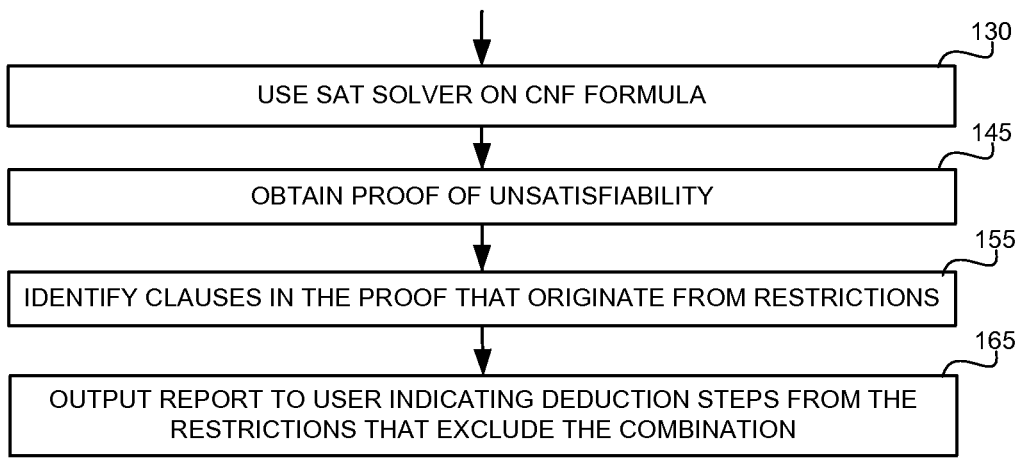
FIG. 1B shows a flowchart diagram of a method, in accordance with some exemplary embodiments of the disclosed subject matter.

Reference is now made to FIG. 1B showing a flowchart diagram of a method, in accordance with some exemplary embodiments of the disclosed subject matter.

After steps 100-130 are performed, In Step 145 a proof of unsatisfiability is obtained from the SAT solver. The proof of unsatisfiability may be a Directed Acyclic Graph (DAG) indicating a series of deduction steps that result in a contradiction that renders the CNF formula as unsatisfiable.

In Step 155, clauses that participate in the proof and that originated from the restrictions may be identified.

In Step 165, a report may be outputted. The report may indicate a deduction that is based on the proof of unsatisfiability but shows the relevant restrictions instead of the clauses.

Figure 2:
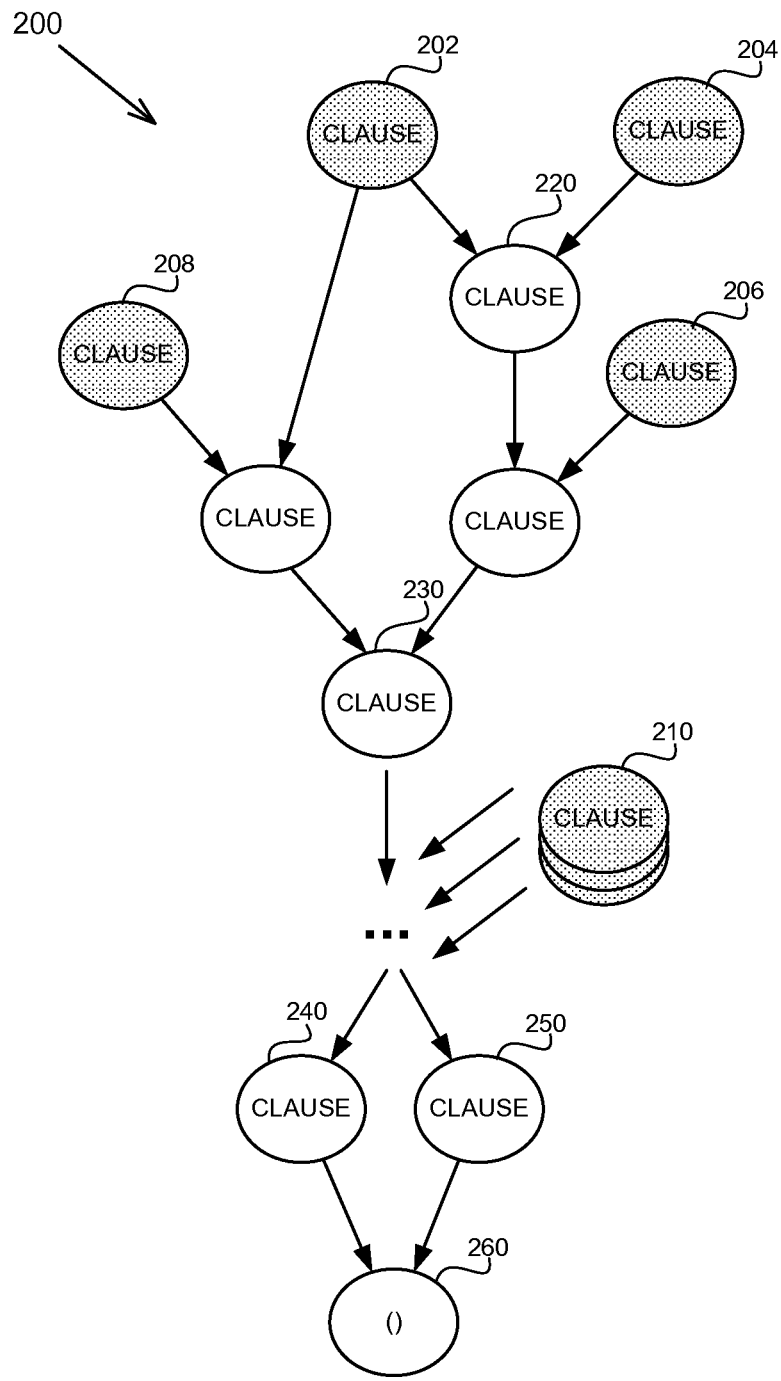
FIG. 2 shows an illustration of a proof of unsatisfiability, in accordance with some exemplary embodiments of the disclosed subject matter.

Reference is now made to FIG. 2 showing an illustration of a proof of unsatisfiability, in accordance with some exemplary embodiments of the disclosed subject matter. Proof 200 may be generated by a SAT solver based on deductions it performs while attempting to solve the CNF formula. Proof 200 may be based on deduction clauses, such as deduced by resolution steps or by other deductive methods. Each node of Proof 200 is a CNF clause. Nodes that have no incoming edges (e.g., 202, 204, 206, 208, 210) represent clauses that appear in the CNF formula itself. Nodes that have incoming edges (e.g., Clause 220) represent clauses that are deduced from two or more clauses as is indicated by the edges. Some deduced clauses may be deduced based on clauses in the CNF (e.g., Node 220), some may be based solely on other deduced nodes (e.g., Node 230), and other may be based on both kind of incoming edges. Proof 200 ends in a conflict between two nodes (240 and 250) which contradict one another and therefore deduce an empty clause (Node 260).

The disclosed subject matter may map the clauses of the CNF formula that participate in the proof to restrictions. It will be noted that the clauses may either originate from the restrictions, from an encoding of a domain, or from an encoding of the combination. The disclosed subject matter may output a graph similar to Proof 200 and based thereof, but instead of listing clauses, it may indicate the restrictions that participate in the proof and how those restrictions interact to cause the combination to be illegal. As an example, if Node 202 is mapped to restriction $R_1$, Node 204 is mapped to restriction $R_2$, Node 206 is mapped to restriction $R_3$ and Nodes 208, 210 are not mapped to any restriction, the output may include a graph in which $R_1$ and $R_2$ are combined with one another to deduce a derived restriction, and the derived restriction is combined with restriction $R_3$ to produce another derived restriction which excludes the combination from the model.

Figure 3:
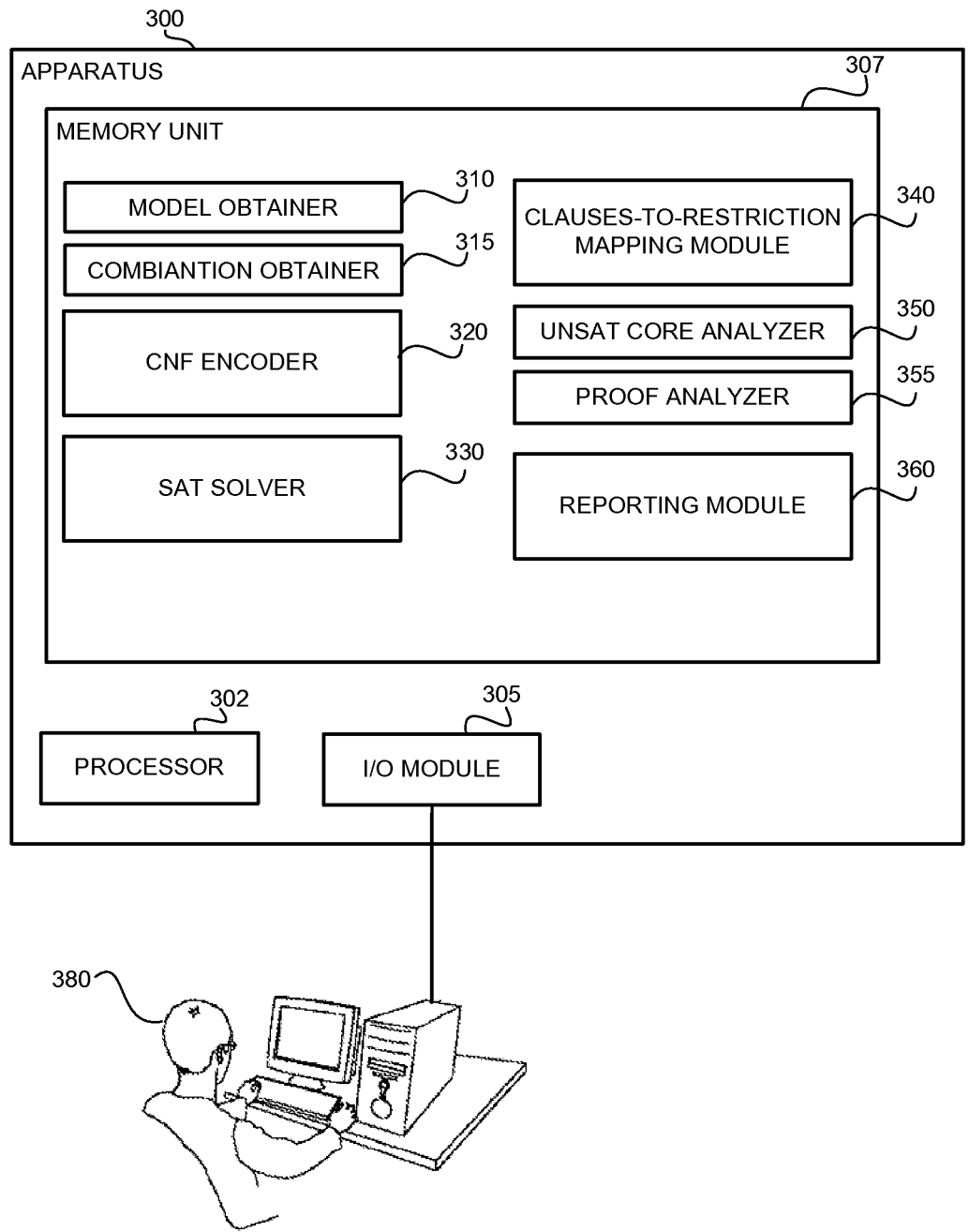
FIG. 3 shows a block diagram of an apparatus, in accordance with some exemplary embodiments of the disclosed subject matter.

Referring now to FIG. 3 showing a block diagram of components of an apparatus, in accordance with some exemplary embodiments of the disclosed subject matter. An apparatus 300 may be a computerized apparatus adapted to perform methods such as depicted in FIGS. 1A and/or 1B.

In some exemplary embodiments, Apparatus 300 may comprise a Processor 302. Processor 302 may be a Central Processing Unit (CPU), a microprocessor, an electronic circuit, an Integrated Circuit (IC) or the like. Alternatively, Apparatus 300 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). Processor 302 may be utilized to perform computations required by Apparatus 300 or any of it subcomponents.

In some exemplary embodiments of the disclosed subject matter, Apparatus 300 may comprise an Input/Output (I/O) Module 305 such as a terminal, a display, a keyboard, an input device or the like to interact with the system, to invoke the system and to receive results. It will however be appreciated that the system can operate without human operation.

In some exemplary embodiments, the I/O Module 205 may be utilized to provide an interface to a User 380 to interact with Apparatus 300, such as by providing the combinatorial model, by modifying the model, by providing a combination, by viewing output provided by Apparatus 300, or the like.

In some exemplary embodiments, Apparatus 300 may comprise a Memory Unit 307. Memory Unit 307 may be persistent or volatile. For example, Memory Unit 307 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, Memory Unit 307 may retain program code operative to cause Processor 302 to perform acts associated with any of the steps shown in FIGS. 1A and/or 1B.

The components detailed below may be implemented as one or more sets of interrelated computer instructions, executed for example by Processor 302 or by another processor. The components may be arranged as one or more executable files, dynamic libraries, static libraries, methods, functions, services, or the like, programmed in any programming language and under any computing environment.

A Model Obtainer 310 may be configured to obtain a combinatorial model, such as from a computer-readable medium and/or from User 380. Similarly, Combination Obtainer 315 may be configured to obtain a combination from a computer-readable medium and/or from User 380.

CNF Encoder 320 may be configured to encode a CNF based on the combinatorial model and the combination obtained by the Obtainers 310 and 315. In some exemplary embodiments, during said encoding, each restriction may be encoded into CNF clauses. A Clauses-to-Restrictions Mapping Module (CRMM) (340) may be configured to retain a mapping between the clauses and the restriction from which they originated. Additionally or alternatively, in case a plurality of clauses are generated based on a single restriction, the clauses may be grouped in a single group to be taken together in a grouped UNSAT core.

SAT Solver 330 may be configured to determine satisfiability or unsatisfiability of the CNF formula produced by CNF Encoder 320. SAT Solver 330 may be configured to utilize assumptions. Additionally or alternatively, SAT Solver 330 may be configured to provide UNSAT core, grouped UNSAT core, or the like. Additionally or alternatively, SAT Solver 330 may be configured to generate proof of unsatisfiability.

UNSAT Core Analyzer 350 may be configured to obtain an UNSAT core from SAT Solver 330 and analyze it to determine which restrictions participated in excluding the combination. UNSAT Core Analyzer 350 may utilize CRMM 340 to correlate between the clauses and the corresponding restrictions.

Proof Analyzer 355 may be configured to obtain a proof of unsatisfiability from SAT Solver 330 and analyze it to determine deduction steps from the restrictions that contradict the combination.

A Reporting Module 360 may be utilized to present output to User 380. The output may visually indicate which restrictions render the combination to be illegal. The output may include the list of the restrictions based on the analysis performed by UNSAT Core Analyzer 350 and/or Proof Analyzer 355. In some exemplary embodiments, the output may include a list of all extensions of the combination and for each such extension an indication which restriction excludes it from the model. Additionally or alternatively, the output may include a series of deduction steps from the restrictions that exclude the combination based on the proof of unsatisfiability.

In some exemplary embodiments, User 380 may utilize a User Interface (UI) in which illegal combinations are indicated. The user may select, such as using a keyboard, a pointing device, or the like, an illegal combination for which he would like to receive an explanation as to its legality. In response to such a selection, Combination Obtainer 315 may obtain the selected combination and Apparatus 300 may implement its functionality to provide an output to User 380.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
    obtaining a combinatorial model, in a system under test (SUT), defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case;
    obtaining an illegal combination, wherein the illegal combination is excluded by one or more restrictions;
    utilizing a Satisfiability solver, executed by a processor, on a satisfiability formula that encodes the legal test space and that assigns values to attributes as defined by the illegal combination, whereby the satistiability solver provides an indication of unsatisfiability of the satistiability formula and an UNSAT core comprising a subset of clauses defined by the satisfiability formula which are unsatisfiable; and
    identifying the one or more restrictions by mapping the clauses of the UNSAT core with clauses encoding the set of restrictions.

2. The computer-implemented method of claim 1, further comprising outputting a report indicating the one or more restrictions that cause the illegal combination to be excluded from the combinatorial model.

3. The computer-implemented method of claim 2, wherein the report comprises listing extensions of the illegal combination and indicating for each extension a restriction of the one or more restrictions that excludes the extension from the test space.

4. The computer-implemented method of claim 3, wherein the extensions are determined based on the set of restrictions.

5. The computer-implemented method of claim 1,
    wherein each set of clauses that is mapped to a restriction is defined as a group of clauses, wherein the UNSAT core is a grouped UNSAT core comprising a subset of the groups;
    whereby if a restriction is included in the UNSAT core, all clauses that correspond to the restriction are also included in the UNSAT core.

6. The computer-implemented method of claim 1, wherein the satisfiability formula is a Conjunctive Normal Form formula which is defined as a conjunction between a negation of each restriction of the set of restrictions and between clauses defining assignment of values based on the illegal combination.

7. The computer-implemented method of claim 1 further comprising:
    based on a proof of unsatisfiability provided by the satisfiability solver, determining a series of deduction steps from the one or more restrictions that cause the illegal combination to be excluded from the test space; and
    outputting a report indicating the deduction steps thereby providing an explanation to a user as to how the one or more restrictions exclude the illegal combination.

8. The computer-implemented method of claim 1, wherein the illegal combination is a partial combination that assigns values to only a subset of the attributes of the combinatorial model; and wherein the illegal combination is excluded by two or more restrictions, each of which does not by itself restrict all extensions of the partial combination.

9. The computer-implemented method of claim 1, wherein the satisfiability solver is a Boolean satisfiability solver and the satisfiability formula is a Boolean formula given in Conjunctive Normal Form.

10. A computerized apparatus having a processor, the processor being adapted to perform the steps of:
    obtaining a combinatorial model, in a system under test (SUT), defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case;

obtaining an illegal combination, wherein the illegal combination is excluded by one or more restrictions;

utilizing a Satisfiability solver on a satisfiability formula that encodes the legal test space and that assigns values to attributes as defined by the illegal combination, whereby the satisfiability solver provides an indication of unsatisfiability of the satisfiability formula and an UNSAT core comprising a subset of clauses defined by the satisfiability formula which are unsatisfiable; and identifying the one or more restrictions by mapping the clauses of the UNSAT core with clauses encoding the set of restrictions.

11. The computerized apparatus of claim 10, wherein the processor being further adapted to perform: outputting a report indicating the one or more restrictions that cause the illegal combination to be excluded from the combinatorial model.

12. The computerized apparatus of claim 11, wherein the report comprises listing extensions of the illegal combination and indicating for each extension a restriction of the one or more restrictions that excludes the extension from the test space.

13. The computerized apparatus of claim 12, wherein the extensions are determined based on the set of restrictions.

14. The computerized apparatus of claim 10,
wherein each set of clauses that is mapped to a restriction is defined as a group of clauses, wherein the UNSAT core is a grouped UNSAT core comprising a subset of the groups;
whereby if a restriction is included in the UNSAT core, all clauses that correspond to the restriction are also included in the UNSAT core.

15. The computerized apparatus of claim 10, wherein the satisfiability formula is a Conjunctive Normal Form formula which is defined as a conjunction between a negation of each restriction of the set of restrictions and between clauses defining assignment of values based on the illegal combination.

16. The computerized apparatus of claim 10, wherein the processor being further adapted to perform:

based on a proof of unsatisfiability provided by the satisfiability solver, determining a series of deduction steps from the one or more restrictions that cause the illegal combination to be excluded from the test space; and outputting a report indicating the deduction steps thereby providing an explanation to a user as to how the one or more restrictions exclude the illegal combination.

17. The computerized apparatus of claim 10, wherein the illegal combination is a partial combination that assigns values to only a subset of the attributes of the combinatorial model; and wherein the illegal combination is excluded by two or more restrictions, each of which does not by itself restrict all extensions of the partial combination.

18. The computerized apparatus of claim 10, wherein the satisfiability solver is a Boolean satisfiability solver and the satisfiability formula is a Boolean formula given in Conjunctive Normal Form.

19. A computer program product comprising:
a non-transitory computer readable medium retaining program instructions, which instructions when read by a processor, cause the processor to perform a method comprising:

obtaining a combinatorial model, in a system under test (SUT), defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case;

obtaining an illegal combination, wherein the illegal combination is excluded by one or more restrictions;

utilizing a Satisfiability solver on a satisfiability formula that encodes the legal test space and that assigns values to attributes as defined by the illegal combination, whereby the satistiability solver provides an indication of unsatisfiability of the satistiability formula and an UNSAT core comprising a subset of clauses defined by the satisfiability formula which are unsatisfiable; and identifying the one or more restrictions by mapping the clauses of the UNSAT core with clauses encoding the set of restrictions.

* * * * *